(12) United States Patent
Abraham et al.

(10) Patent No.: US 8,852,677 B2
(45) Date of Patent: *Oct. 7, 2014

(54) MAGNETIC RANDOM ACCESS MEMORY WITH SYNTHETIC ANTIFERROMAGNETIC STORAGE LAYERS AND NON-PINNED REFERENCE LAYERS

(75) Inventors: David W. Abraham, Croton, NY (US); Michael C. Gaidis, Wappingers Falls, NY (US); Janusz J. Nowak, Highlands Mills, NY (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/566,132

(22) Filed: Aug. 3, 2012

(65) Prior Publication Data

US 2014/0038309 A1 Feb. 6, 2014

Related U.S. Application Data

(63) Continuation of application No. 13/562,868, filed on Jul. 31, 2012.

(51) Int. Cl.
*B32B 15/04* (2006.01)
*B05D 5/12* (2006.01)
*B05D 5/00* (2006.01)
*B32B 15/00* (2006.01)

(52) U.S. Cl.
USPC ........... 427/131; 427/132; 427/127; 427/128; 428/692.1; 428/693.1; 428/826; 428/527; 428/828; 428/829

(58) Field of Classification Search
USPC ............ 427/131, 132; 428/692.1, 693.1, 826, 428/827, 828, 829
See application file for complete search history.

(56) References Cited

U.S. PATENT DOCUMENTS

| 4,780,173 | A | 10/1988 | Wentz |
| 6,985,385 | B2 | 1/2006 | Nguyen et al. |
| 7,126,202 | B2 | 10/2006 | Huai et al. |
| 7,351,483 | B2 | 4/2008 | Parkin |
| 7,480,173 | B2 | 1/2009 | Guo et al. |
| 7,502,253 | B2 | 3/2009 | Rizzo |
| 7,605,437 | B2 | 10/2009 | Mancoff et al. |
| 7,750,421 | B2 | 7/2010 | Horng et al. |
| 7,791,845 | B2 | 9/2010 | Mauri et al. |
| 7,897,274 | B2 | 3/2011 | Yuasa et al. |
| 7,948,044 | B2 | 5/2011 | Horng et al. |
| 8,004,881 | B2 | 8/2011 | Zhu et al. |

(Continued)

OTHER PUBLICATIONS

S. S. Cherepov et al., "Resonant Activation of a Synthetic Antiferromagnet," Phys. Rev. Lett., vol. 107, 2011, 077202, 5 pages.

(Continued)

*Primary Examiner* — Sanza McClendon
(74) *Attorney, Agent, or Firm* — Cantor Colburn LLP; Vazken Alexanian

(57) ABSTRACT

A method for fabricating a synthetic antiferromagnetic device, includes depositing a magnesium oxide spacer layer on a reference layer having a first and second ruthenium layer, depositing a cobalt iron boron layer on the magnesium oxide spacer layer; and depositing a third ruthenium layer on the cobalt iron boron layer, the third ruthenium layer having a thickness of approximately 0-18 angstroms.

6 Claims, 3 Drawing Sheets

(56) References Cited

U.S. PATENT DOCUMENTS

| | | |
|---|---|---|
| 8,036,024 B2 | 10/2011 | Takenaga et al. |
| 8,057,925 B2 | 11/2011 | Horng et al. |
| 8,216,703 B2 | 7/2012 | Sun et al. |
| 8,268,641 B2 | 9/2012 | Guo et al. |
| 8,274,818 B2 | 9/2012 | Ohno et al. |
| 8,404,367 B2 | 3/2013 | Horng et al. |
| 8,547,737 B2 | 10/2013 | Daibou et al. |
| 8,609,262 B2 | 12/2013 | Horng et al. |
| 2004/0075125 A1 | 4/2004 | Asao |
| 2004/0213071 A1 | 10/2004 | Hiramoto et al. |
| 2006/0012926 A1 | 1/2006 | Parkin |
| 2007/0091675 A1 | 4/2007 | Hou et al. |
| 2007/0139827 A1 | 6/2007 | Gao et al. |
| 2007/0243639 A1 | 10/2007 | Pietambaram et al. |
| 2007/0278547 A1 | 12/2007 | Pietambaram et al. |
| 2008/0225583 A1 | 9/2008 | Guo et al. |
| 2009/0046397 A1 | 2/2009 | Sun et al. |
| 2009/0161267 A1* | 6/2009 | Kawai et al. ............ 360/324.2 |
| 2009/0321246 A1 | 12/2009 | Tsunekawa et al. |
| 2010/0019798 A1* | 1/2010 | Saito et al. ............ 326/49 |
| 2011/0194341 A1 | 8/2011 | Gaidis et al. |
| 2011/0293967 A1 | 12/2011 | Zhang et al. |
| 2012/0061783 A1 | 3/2012 | Anderson et al. |
| 2012/0135275 A1 | 5/2012 | Kariyada et al. |
| 2012/0205758 A1 | 8/2012 | Jan et al. |
| 2012/0288964 A1 | 11/2012 | Gaidis et al. |
| 2013/0069186 A1 | 3/2013 | Toko et al. |
| 2013/0075846 A1 | 3/2013 | Suemitsu et al. |
| 2013/0175644 A1 | 7/2013 | Horng et al. |
| 2013/0307097 A1 | 11/2013 | Yi et al. |

OTHER PUBLICATIONS

J. Hayakawa et al., "Current-Induced Magnetization Switching in MgO Barrier Magnetic Tunnel Junctions With CoFeB-Based Synthetic Ferrimagnetic Free Layers," IEEE Transactions on Magnetics, vol. 44, Issue 7, Jul. 2008, pp. 1962-1967.

K. Lee et al., "Development of Embedded STT-MRAM for Mobile System-on-Chips," IEEE Transactions on Magnetics, vol. 47, Issue 1, Jan. 2011, 131-136.

K. Lee et al., "Effect of interlayer coupling in CoFeB/Ta/NiFe free layers on the critical switching current of MgO-based magnetic tunnel junctions," J. Appl. Phys., vol. 106, 2009, 024513, 4 pages.

B.-C. Min et al., "MgO-based magnetic tunnel junctions for spin-transfer-torque random access memory," 10th IEEE Conference on Nanotechnology (IEEE-NANO), Aug. 17-20, 2010, pp. 144-147.

M Nishimura et al, "Spin-transfer switching in magnetic tunnel junctions with synthetic ferri-magnetic free layer," J. Phys.: Conf. Ser., vol. 200, 2010, 052018, 4 pages.

S. Yakata et al., "Enhancement of Thermal Stability Using Ferromagnetically Coupled Synthetic Free Layers in MgO-Based Magnetic Tunnel Junctions," IEEE Transactions on Magnetics, vol. 46, Issue 6, Jun. 2010, pp. 2232-2235.

S. Yakata et al., "Thermal stability and spin-transfer switchings in MgO-based magnetic tunnel junctions with ferromagnetically and antiferromagnetically coupled synthetic free layers," Appl. Phys. Lett., vol. 95, 2009, 242504, 3 pp.

* cited by examiner

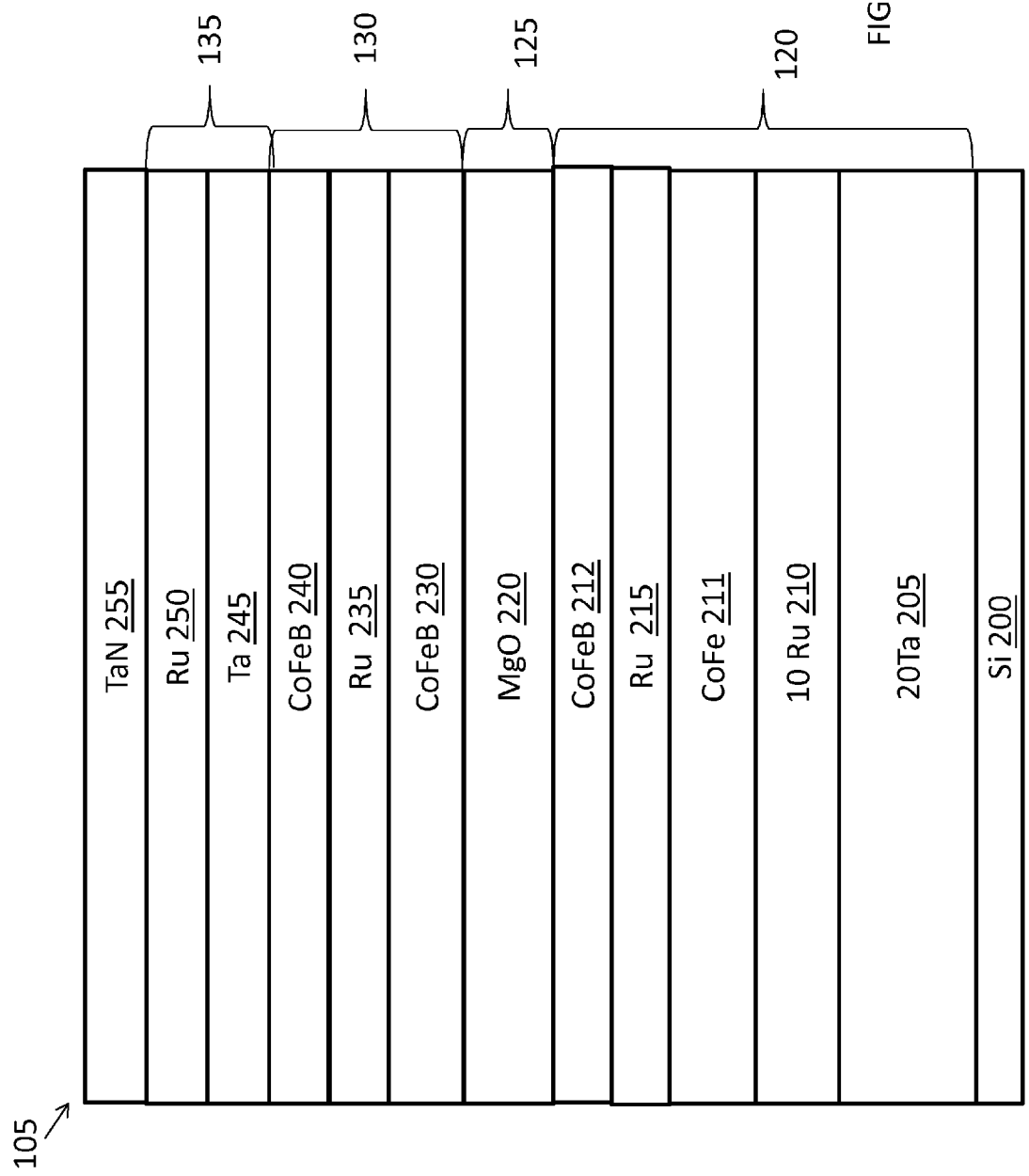

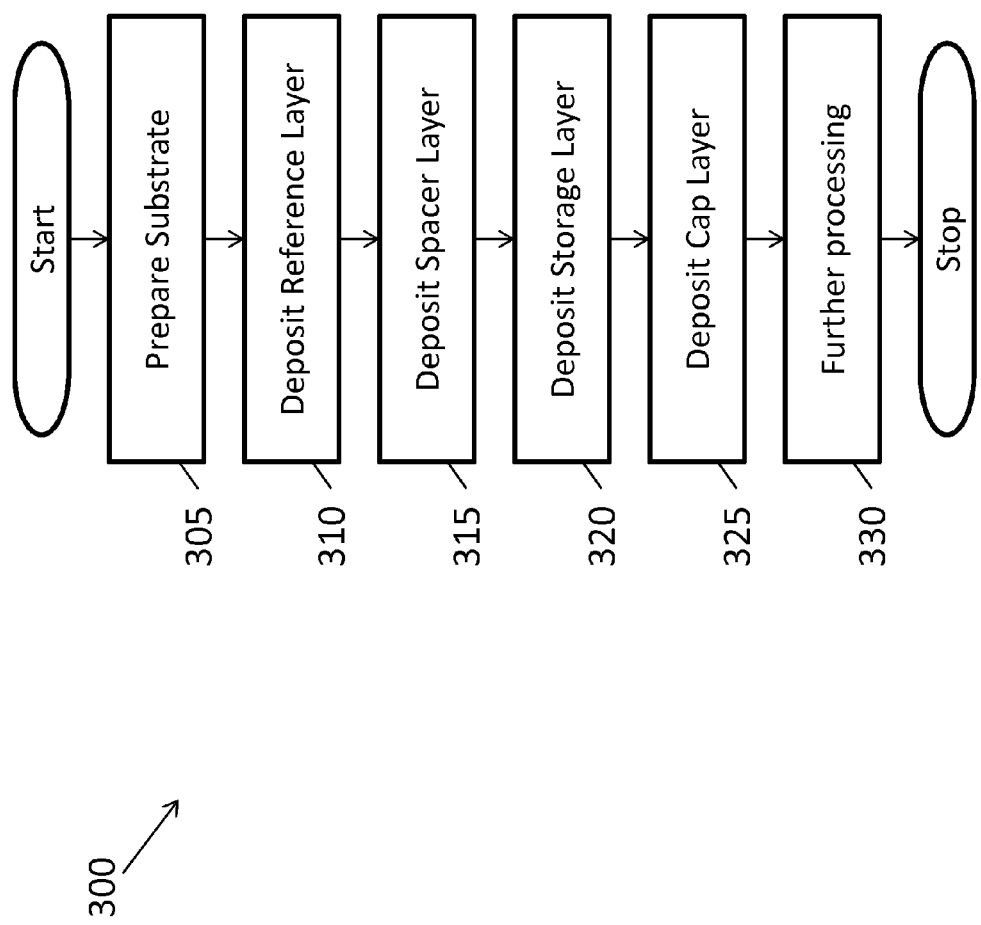

MAGNETIC RANDOM ACCESS MEMORY WITH SYNTHETIC ANTIFERROMAGNETIC STORAGE LAYERS AND NON-PINNED REFERENCE LAYERS

CROSS REFERENCE TO RELATED APPLICATIONS

This application is a continuation of U.S. patent application Ser. No. 13/562,868 filed Jul. 31, 2012, the contents of which are incorporated herein by reference thereto.

BACKGROUND

The present invention relates to magnetic random access memory devices, and more specifically, to a high anneal temperature synthetic antiferromagnetic (SAF) freelayer and non-pinned reference layer for magnetic random access memory (MRAM) devices.

MRAM devices require the use of a storage and a reference layer. The storage layer is often comprised of a ferromagnetic layer which is fixed in magnetic orientation in spite of the influence of magnetic fields or spin torques by the pinning effects of an antiferromagnetic layer adjacent to it. In addition, SAF storage layers are implemented in MRAM with certain advantages. For example, it appears that higher activation energy can be obtained for equivalent switching currents when using a SAF structure versus a simple single free layer. Currently, the results in this example are obtained with low-temperature annealing and processing. However, for many semiconductor applications (particularly for embedded memory applications) it is important that the process be compatible with existing CMOS fabrication requirements. In practice, this means that the MRAM device must be able to withstand high temperature annealing and processing, with temperatures in the range of 400° C. for 1 hour total exposure time. Currently, it is also possible to fabricate SAF structures, which survive 400° C. anneals, demonstrating strong coupling in the SAF. Spin torque switching has been observed for anneal temperatures of up to 350° C. However, the current density can be too large to be practically employed and even for these demonstrations, the activation energy reported was only 62 kT. For applications in MRAM, an activation energy of at least 80 kT is typically required. In addition, conventional devices lose pinning and also magnetoresistance even for anneal temperatures below 400° C.

SUMMARY

Exemplary embodiments include a method for fabricating a synthetic antiferromagnetic device, the method including depositing a magnesium oxide spacer layer on a reference layer having a first and second ruthenium layer, depositing a cobalt iron boron layer on the magnesium oxide spacer layer; and depositing a third ruthenium layer on the cobalt iron boron layer, the third ruthenium layer having a thickness of approximately 0-18 angstroms.

Additional exemplary embodiments include a method for fabricating a synthetic antiferromagnetic device, the method including depositing a spacer layer disposed on a reference layer having a first ruthenium layer and a second ruthenium layer, depositing a storage layer on the spacer layer, the storage layer including an additional ruthenium layer having a thickness of approximately 0-18 angstroms, and depositing a cap layer on the storage layer.

Further exemplary embodiments include a method for fabricating a synthetic antiferromagnetic device, the method including depositing a first tantalum layer on a substrate, depositing a first ruthenium layer on the first Ta layer, the first ruthenium layer having a thickness of approximately 10 angstroms, depositing a cobalt iron layer on the first ruthenium layer, depositing a second ruthenium layer on the cobalt iron layer, the second ruthenium layer having a thickness of approximately 21 angstroms, depositing a first cobalt iron boron layer on the second ruthenium layer, depositing a magnesium oxide spacer layer on the first cobalt iron boron layer, depositing a second cobalt iron boron layer on the magnesium oxide spacer layer, depositing a third ruthenium layer on the second cobalt iron boron layer, the third ruthenium layer having a thickness of approximately 18 angstroms, depositing a third cobalt iron boron layer on the third ruthenium layer, depositing a cap layer on the third cobalt iron boron layer, coupling a bottom contact to the substrate and coupling a top contact to the cap layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates exemplary SAF devices; and

FIG. 3 illustrates a SAF fabrication method in accordance with exemplary embodiments.

DETAILED DESCRIPTION

Figure 1:
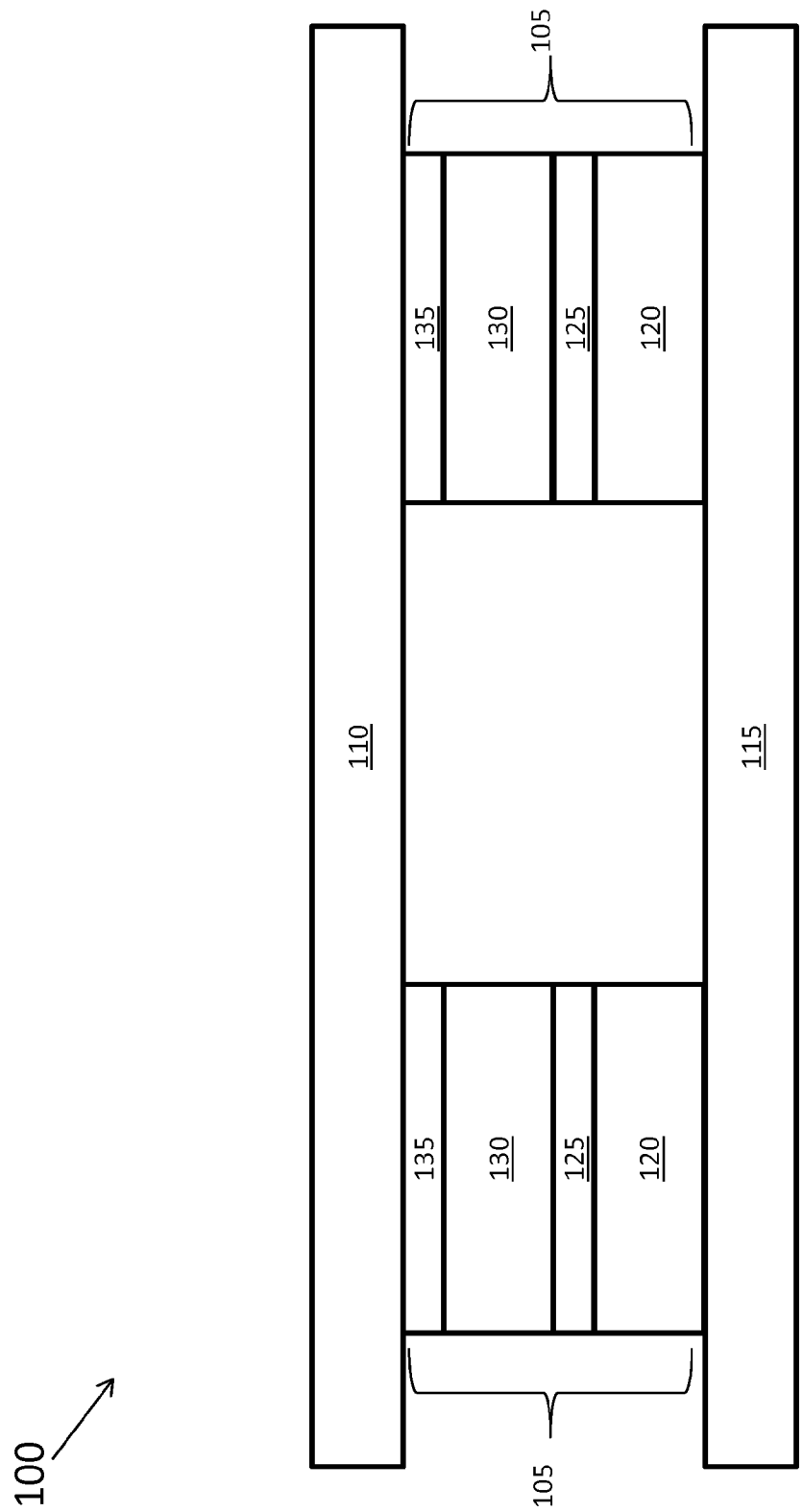
FIG. 1 illustrates an exemplary SAF device.

FIG. 1 illustrates an exemplary a SAF device 100 that includes high anneal temperature SAF storage (free) layers and non-pinned reference layers for magnetic random access memory devices. The device illustrates two SAF devices 105, although it will be appreciated that additional or fewer SAF devices are contemplated in other exemplary embodiments. The device 100 includes a top contact 110 and a bottom contact 115 coupled to the SAF devices 105.

In exemplary embodiments, each of the SAF devices 105 includes a non-pinned reference layer 120 coupled to the bottom contact 115. In exemplary embodiments, the reference layer 120 can be any standard reference layer to provide a reference electrode. The SAF devices 105 further include a spacer layer 125 disposed on the reference layer 120 and a storage layer 130 disposed on the spacer 125. The SAF devices 105 further include a cap layer 135 disposed between the storage layer 130 and the top contact 110.

In exemplary embodiments, the SAF devices 105 described herein incorporate the storage layer 130, which combines both thermal stability at 400° C. for the required period and switching with appropriately low switching currents, device resistance, activation energy and coercivity to allow proper functioning in an MRAM device. As further described herein, the implementation of ruthenium (Ru) in the storage layer at various thicknesses provides the thermal stability and target operating parameters in the final MRAM device. In exemplary embodiments, the SAF devices 105 described herein are stable to 400° C. The SAF devices 105 include a non-pinned SAF reference layer 120 combined with a non-pinned storage layer 130. As described herein, by implementing a relatively thicker ruthenium (Ru) spacer layers, antiferromagnetic orientation is still assured, but thermal stability is significantly enhanced. Degradation of the stack performance (in terms of magnetics and in magnetoresistance) is reduced by elimination of the antiferromagnetic materials typically used, including in particular manganese (when using for example PtMn or FeMn). Orientation of the reference layer is improved as well, since the etched shape determines the orientation of the reference layer and as such is more reliably controlled than the granular orientation of the antiferromagnet.

FIG. 2 illustrates the SAF devices 105 in further detail. FIG. 3 illustrates a SAF fabrication method 300 in accordance with exemplary embodiments. At block 305, the substrate 200 is prepared. The substrate 200 can be silicon (Si). In order to attain magnetic tunnel junction (MTJ) performance in the final MRAM device, preparation of the substrate 200 includes attaining atomic-scale flatness over areas of the order of the size of an MTJ. Atomic scale flatness reduces dipolar magnetic coupling effects and makes for a well-controlled MRAM device. Substrates for the processes are thus generally prepared either with a careful silicon wafer oxidation/cleaning or with the deposition of a dielectric such as silicon nitride (SiN) on the substrate 200, followed by a chemical-mechanical planarization (CMP) step to smooth the surface.

At block 310, the reference layer 120 is deposited. As described herein, the reference layer 120 can include a non-pinned reference layer, which can include a first tantalum (Ta) layer 205 to promote polycrystalline growth. In the example of FIG. 2, the first Ta layer 205 could be tantalum nitride (TaN). In the example of FIG. 2, a first Ru layer 210 is deposited on the first Ta layer 205 as part of the reference layer 120. It can be appreciated that the First Ta layer 205 and the first Ru layer 210 are implemented as a seed layer. A cobalt iron (CoFe) layer 211 is deposited on the first Ru layer 210. A second Ru layer 215 is then deposited on the CoFe layer 211. Finally, a first cobalt iron boron (CoFeB) layer 212 is deposited on the second Ru layer 215.

At block 315, the spacer layer 125 is deposited on the reference layer 120. In exemplary embodiments, the spacer layer 125 is a suitable insulating electrical bridge (e.g., aluminum oxide ($Al_2O_3$) or magnesium oxide (MgO)). In the example in FIG. 2, the spacer layer is an MgO layer 220.

At block 320, the storage layer 130 is deposited on the spacer layer 125. In the example in FIG. 2, a second CoFeB layer 230 is deposited on the spacer layer 125, followed by a deposition of third Ru layer 235 and a third CoFeB layer 240.

At block 325, a suitable cap layer 135 is deposited on the storage layer 130. In the example shown in FIG. 2, the cap layer 135 includes a second Ta layer 245 deposited on the storage layer 130 followed by a deposition of a fourth Ru layer 250. In exemplary embodiments a hardmask TaN layer 255 can be deposited on the fourth Ru layer 250. The cap layer 135 and the hardmask TaN layer protect the SAF device 105 during the aggressive etch which defines the device 100.

As described herein, the reference layer 120 and the storage layer 130 each include Ru spacers (e.g., each in about the 18 angstroms (Å) thickness range), tuned for maximum coupling after 400 C/1 hr anneals. The specific SAF devices as in the example described herein are selected for maximum coupling and thermal stability, so the details of the magnetic layers (in the example) are important for best performance. The exemplary device 100 demonstrates an SAF device, which, after 400° C. anneal, shows a) successful operation including magnetoresistance and clean separation of the switching behavior of the reference and storage layers and b) improved performance in the alignment of the reference layer compared to the conventional pinned structure using antiferromagnetic layers.

At block 330, further semiconductor processing can be implemented. For example, the SAF device 100 can be encapsulated in a dielectric. The encapsulation of the SAF device 100 protects the SAF device 100 while at the same time forming the environment in which the attachment of the top and bottom contacts 110, 115 can be implemented. The choice of encapsulation is determined from three requirements: a) it must not damage the SAF devices 100; b) it must adhere well to the substrate 200; and c) it should closely emulate the interlayer dielectrics (ILDs) that would be used in a fully integrated wafer processes. For example, damage to the MTJs can arise from chemical interactions and thermal stress. Standard semiconductor-industry dielectrics typically are deposited or cured at temperatures around 400° C., whereas degradation in submicron MTJs can set in at temperatures below 350° C. Thus, a major challenge to the integrator of MRAM devices is the development and utilization of suitable low temperature dielectrics. However, it will be appreciated that the SAF device can withstand the high anneal temperatures discussed above. Adhesion of the dielectric to the substrate can be particularly problematic given the characteristics of the magnetic films being used. Noble-metal-containing antiferromagnets can be particularly difficult to adhere to, and, if exposed by the etching used for MTJ patterning, can require specialized surface-cleaning or surface-preparation techniques to promote adhesion to the encapsulating dielectric. The dielectric thickness is chosen such that it will be thick enough to provide the environment for the wiring level above the MTJs.

Other semiconductor processing includes suitable patterning of the spacer layer 125. Patterning of the MTJ introduces device-to-device isolation in the counter-electrode (the conductive portion of the storage layer 130 above the spacer layer 125), but maintains electrical continuity between desired devices in the base electrode (the conductive portion of the reference layer 120 below the spacer layer 125). Often negligible in fully integrated wafers, the resistance of the base electrode after MTJ patterning is germane to the short loop. The use of a continuous planar base electrode incurs additional measurement error at final electrical testing if the base electrode possesses a high sheet resistance. Subject to the constraint of emulating the stack used in fully functional wafers, the magnetic stack of the short loop will therefore include thick or low resistivity films beneath the tunnel barrier. A commonly used, straightforward approach to patterning the MTJs is through the use of a conducting hard mask. The conducting mask is later utilized as a self-aligned stud bridging the conductive MT wiring to the active magnetic films in the device. Such a processing scheme is among the simplest and fastest ways of creating and contacting the MTJs, making it an ideal approach for use in the short loop. Choices for the hard mask are numerous, with necessary characteristics being etchability and a resistance that is negligible when compared with MTJ resistance. Refractory materials commonly used in the semiconductor industry such as Ta, TaN, and TiN are suitable as masks for MTJ patterning. The MTJ shapes are defined in the hard mask by transfer from a first photomask level in a process such as the following: apply resist/expose and develop/reactive ion etching (RIE) through hard mask/strip resist. The pattern is further transferred downward to penetrate to (or through) the tunnel barrier, leaving behind a low-resistance base layer which covers the entire wafer.

Other semiconducting fabrication processes can include planarization. To facilitate industry standard damascene copper wiring, the wafers generally undergo a gentle dielectric CMP process at this stage. The purpose of the CMP is to remove topography from the surface that is caused by the underlying MTJs. This step is also the first check of the adhesion of the dielectrics to the underlying metal films, as well as the cohesion of the metal films to each other. If the encapsulating dielectrics are suitably planarizing in their deposition, this CMP planarization step can be eliminated for faster turnaround time and potentially higher yield.

After completion of the steps for MRAM development (e.g., layer formation, patterning, and encapsulation), the wiring (e.g., applying the bottom and top contacts 110, 115) is instituted in the simplest manner consistent with the available tooling. Relying on well-established semiconductor-industry techniques, a photomask defined trench is etched into the dielectric with RIE, to be filled with a liner and high-conductivity copper. The depth of the trench is sufficient to expose a portion of the conducting hard-mask stud (the counter-electrode), while not so deep as to create a short circuit to the planar base electrode. Endpointing during the trench RIE can facilitate the proper choice of trench depth even for relatively thin hard-mask films. After the trench etching and a suitable cleaning step, the wiring liner film is deposited, along with a thin copper seed layer. This deposition is followed by the electroplating of copper to completely fill the trench and provide enough overburden so that the ensuing CMP step will planarize the metal coincident with the surface of the dielectric. This final CMP step can be aggressive enough to cause shear failure of the films on the wafers, and care must be taken to prevent such delamination. A post-polish cleaning of the wafers is the final preparation step before electrical testing.

EXAMPLE

In one embodiment, the best thermal stability after the different curing/annealing fabrication steps and combination of switching voltage and magnetoresistance, occurred for the composition as now described. The first Ta layer 205 is 20 Å. The first Ru layer 210 is 10 Å. The CoFe layer 211 is 35 Å and the specific composition is $Co_{75}Fe_{25}$. The second Ru layer 215 is 21 Å. The first CoFeB layer 212 is 30 Å and the specific composition is $Co_{60}Fe_{20}B_{20}$. The spacer layer 125 of MgO is formed by depositing 9 Å of Mg following by a 60 second exposure to oxygen gas under a rate of 100 standard centimeter cube per minute (seem). Another layer of 4 Å of MG is deposited followed by a 60 second exposure to oxygen under a rate of 100 sccm. Finally, another layer of 3 Å of Mg is deposited. It can be appreciated that any thickness of Mg and natural oxidation can be implemented. The storage layer 130 is then deposited with 20 Å of the second CoFeB layer 230, with a specific composition of $Co_{60}Fe_{20}B_{20}$. The third Ru layer 235 is then deposited at a thickness of 18 Å. The third layer of CoFeB 240 is then deposited at a thickness of 24 Å and a specific composition of $Co_{60}Fe_{20}B_{20}$. The cap layer 135 is then deposited including the fourth Ta layer 245 at a thickness of 10 Å, and the fourth Ru layer 250 at a thickness of 200 Å. Finally, the hard mask TaN layer 255 is deposited at a thickness of 1000 Å.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a synthetic antiferromagnetic (SAF) device, the method comprising:
   depositing a spacer layer disposed on a reference layer having a first ruthenium (Ru) layer and a second Ru layer;
   depositing a storage layer on the spacer layer, the storage layer including an additional Ru layer having a thickness of approximately 0 angstroms (Å) to 18 Å;
   depositing a cap layer on the storage layer;
   depositing a cobalt iron boron (CoFeB) layer on the spacer layer;
   depositing a third Ru layer on the CoFeB layer; and
   depositing an additional CoFeB layer on the third Ru layer.

2. A method for fabricating a synthetic antiferromagnetic (SAF) device, the method comprising:
   depositing a first tantalum (Ta) layer on a substrate;
   depositing a first ruthenium (Ru) layer on the first Ta layer, the first Ru layer having a thickness of approximately 10 angstroms (Å);
   depositing a cobalt iron (CoFe) layer on the first Ru layer;
   depositing a second Ru layer on the CoFe layer, the second Ru layer having a thickness of approximately 21 Å;
   depositing a first cobalt iron boron (CoFeB) layer on the second Ru layer;
   depositing a magnesium oxide (MgO) spacer layer on the first CoFeB layer;
   depositing a second CoFeB layer on the MgO spacer layer;
   depositing a third Ru layer on the second CoFeB layer, the third Ru layer having a thickness of approximately 18 Å;
   depositing a third CoFeB layer on the third Ru layer;

depositing a cap layer on the third CoFeB layer;
coupling a bottom contact to the substrate; and
coupling a top contact to the cap layer.

3. The method as claimed in claim 2 wherein the MgO spacer layer is magnetically coupled to the first and second CoFeB layers, and the first and second Ru layers after the device is subject to anneal temperatures of about 375° C. to 400° C.

4. The method as claimed in claim 1 wherein the first Ru layer is approximately 10 Å.

5. The method as claimed in claim 4 wherein the reference layer is magnetically coupled to the spacer layer.

6. The method as claimed in claim 1 wherein the second Ru layer is approximately 21 Å.

* * * * *